United States Patent [19]

Elmer et al.

[11] 4,024,514
[45] May 17, 1977

[54] MULTIPHASE SERIES-PARALLEL-SERIES CHARGE-COUPLED DEVICE REGISTERS WITH SIMPLIFIED INPUT CLOCKING

[75] Inventors: Ben R. Elmer, Glendale; Wallace E. Tchon; Anthony J. Denboer, both of Phoenix, all of Ariz.

[73] Assignee: Honeywell Information Systems, Inc., Phoenix, Ariz.

[22] Filed: June 30, 1975

[21] Appl. No.: 591,724

[52] U.S. Cl. .......................... 340/173 CA; 357/24
[51] Int. Cl.² ........................................ G11C 11/44
[58] Field of Search ...... 357/24; 340/173 R, 173 C, 340/173 CA

[56] References Cited

UNITED STATES PATENTS

| | | | |
|---|---|---|---|
| 3,913,077 | 10/1975 | Erb | 340/173 C |
| 3,914,748 | 10/1975 | Barton et al. | 340/173 C |

OTHER PUBLICATIONS

B545,945, Jan. 1976, Chan, 340/173 CA.

*Primary Examiner*—Marshall M. Curtis
*Attorney, Agent, or Firm*—William W. Holloway, Jr.; Ronald T. Reiling; Nicholas Prasinos

[57] ABSTRACT

The invention comprises a charge-coupled device shift register for storing and transferring bits of information in the form of small packets of charge. The apparatus utilizes multiphase clocking to allow for high density storage within the register which is comprised of three sections: serial input section, central storage section and serial output section. The serial input section receives charge packets synchronously from an injector circuit and is driven by two phase clocking. The central section forms the heart of the storage and transfer mechanism and is driven by multiphase clocking. The serial output section, also driven by two-phase clocking, synchronously emits charge packets which are sensed and amplified by a sense amplifier circuit.

The input and output sections each contain (almost) twice the number of cell sites as the number of bits which are transferred in parallel through the central section. However, these sections store data bits in only every other cell site. Data bits are transferred into and out of the central section in one parallel step, thereby minimizing the clocking requirements of the register and allowing for high density CCD chips containing such registers.

19 Claims, 12 Drawing Figures

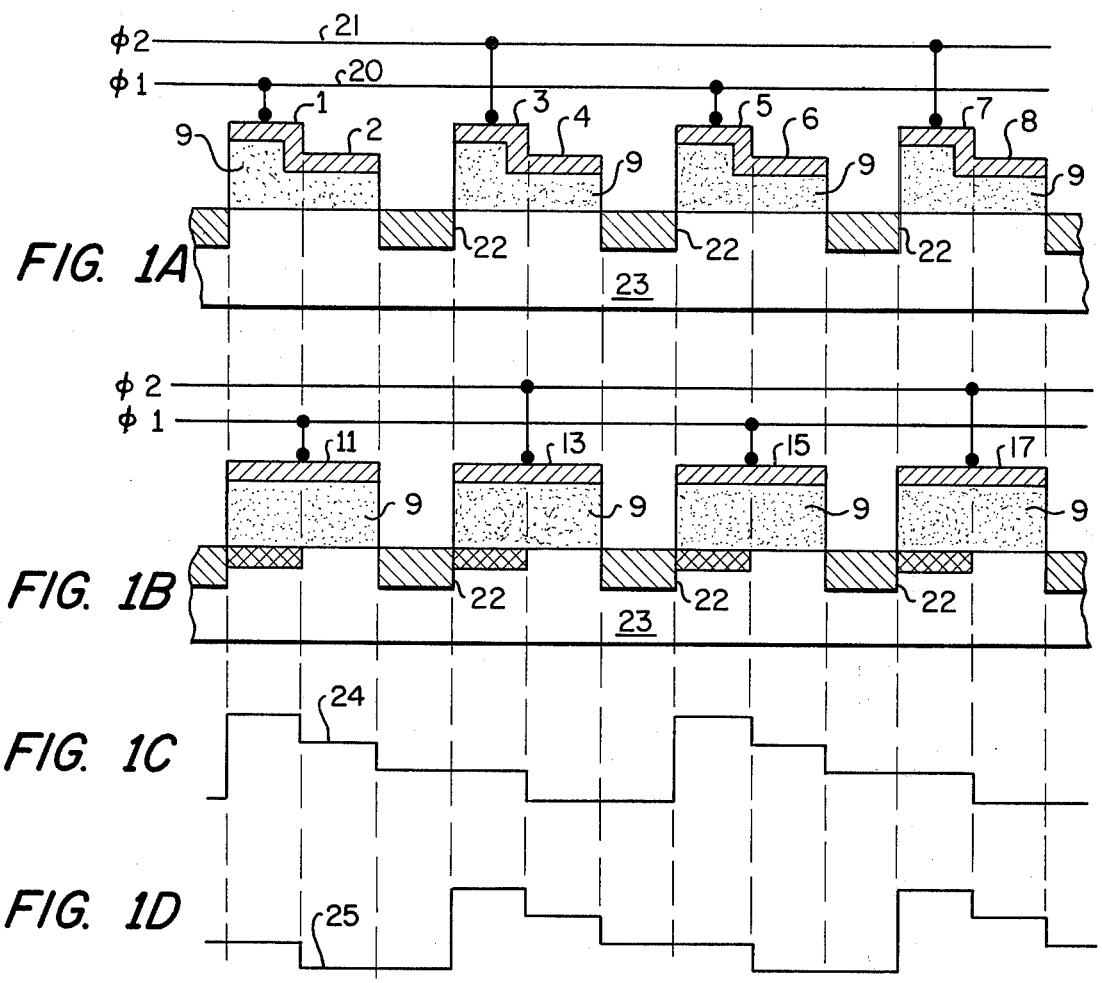
FIG. 1A
FIG. 1B
FIG. 1C
FIG. 1D
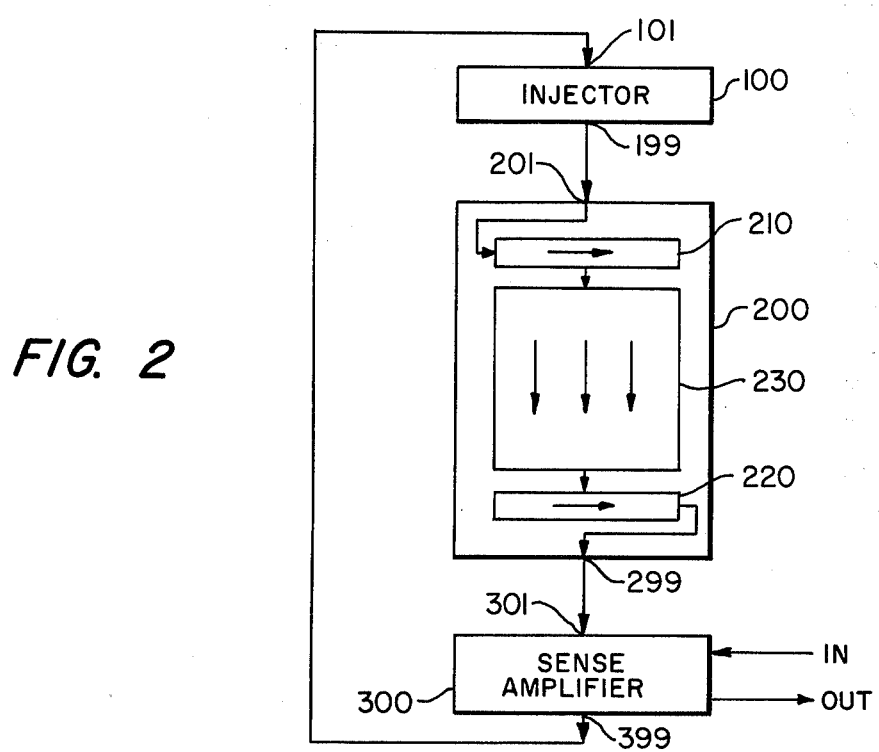
FIG. 2

□ STORAGE SITE
○ GATING SITE

MULTIPHASE SERIES-PARALLEL-SERIES CHARGE-COUPLED DEVICE REGISTERS WITH SIMPLIFIED INPUT CLOCKING

RELATED APPLICATIONS

The following U.S. Patent Applications, all assigned to the same assignee as named herein, are contain disclosure relevant to the instant application:

1. "Staggered Oxide Conductivity Connected Charge-Coupled Device" by Wallace E. Tchon, Ser. No. 475,370, filed on June 3, 1974.
2. "Work Function Barrier Charge-Coupled Device" by Wallace E. Tchon, Ser. No. 475,371, filed on June 3, 1974.
3. "Charge Injectors For CCD Registers" by Wallace E. Tchon, Ser. No. 592,147, filed on June 30, 1975.
4. "Charge Detectors For CCD Registers" by Ben R. Elmer and Wallace E. Tchon, Ser. No. 591,667, filed on June 30, 1975.
5. "CCD Register Interface With PARTIAL-WRITE Mode" by Ben R. Elmer and Wallace E. Tchon, Ser. No. 591,723, filed on June 30. 1975.
6. "Chain Selection Scheme In A Fault Tolerant Mode And Circuits For Implementing Same In CCDs" by Ben R. Elmer, Ser. No. 592,155, filed on June 30, 1975.
7. "Fault Tolerant CCD Memory Chip" by Ben. R. Elmer and Wallace E. Tchon, Ser. No. 591,666, filed on June 30, 1975.
8. "Multiphase Series-Parallel-Series Charge-Coupled Device Registers" by Ben R. Elmer et al., Ser. No. 592,156, filed on June 30, 1975.

BACKGROUND OF THE INVENTION

1. Field of the Invention

The invention relates generally to configurations for efficient utilization of charge-coupled devices as storage registers, and more particularly to apparatus forming a multiphase series-parallel-series (SPS) charge-coupled device (CCD) shift register.

2. Description of the Prior Art

In data processing technology, memories, devices for storage of information, are of critical importance. A recent development in this technology is that of charge-coupled devices. The basic operation of charge-coupled devices (CCDs) has been explained in detail in the technical and patent literature, but a brief summary of the operation of such devices is believed to facilitate an understanding of the present invention. While the operation of a charge-coupled device will be given in terms of specific semiconductor material types, it will be understood that in general where N-type material is specified, P-type material may be substituted and vice versa. The device can also be implemented using buried channel technology.

A typical charge-coupled device may consist of an N-type silicon substrate (in which holes are normally the minority signal carriers) with a silicon dioxide insulating layer superimposed on its surface. An arrangement of conducting electrodes is deposited on the surface of the insulator.

When clock voltages are applied to predetermined groupings of the electrodes, the holes in the vicinity of each electrode, assuming that holes are initially present (as a result, for example, of injection into the device), will move one charge-coupled element, or unit cell, in a predetermined direction for each full clock cycle. The packets of charge move in the predetermined direction as a result of the continuous lateral displacement of the local potential well in which they find themselves. Charge-coupling is thus the collective transfer of all the mobile electric charge stored within a semiconductor storage element to a similar, adjacent storage element by the external manipulation of clock voltages.

The quantity of charge capable of being stored in the mobile packets can vary widely, depending on the applied voltages, on the capacitance of the storage element and other factors. The amount of electric charge in each packet can represent information. Charge-coupled devices have utility in photosensor arrays, delay lines, shift registers, buffer memories, sequential-access memories, fast-access scratch-pad memories, refresh memories, and other information storage and transfer mechanisms.

The focus of the present invention is not concerned with the physical structure, i.e. the internal charge transfer and charge storage portions of a charge-coupled device, nor with the manufacturing processes for effecting the same. Several types of charge storage and charge transfer structures are known in the art. Two such structures are described in "Staggered Oxide Conductivity Connected Charge-Coupled Device" and "Work Function Barrier Charge-Coupled Device", Related Application Nos. 1 and 2, respectively, and may be utilized in conjunction with the present invention. These inventions permit closer row-to-row spacing and hence, a structure of higher density than some other prior art devices. They also eliminate the necessity of closely-spaced electrodes and the attendant problems associated with such design as well as reduce the power consumption and allow for relatively high operational frequency of charge-coupled devices.

The present invention is concerned with utilization of CCDs as memory devices in computer systems. Such memories are generally of two types: main memories which are characteristically fast and expensive, and auxiliary memories which are relatively slow but cheap. CCD-type memories are envisioned as a third (intermediary) memory, with particular utility as a cache memory, i.e. a buffer unit between main and auxiliary memories. In such applications, CCDs could present considerable advantages if their potential for providing high density storage can be realized. Essential to such realization is the requirement of having the highest density registers possible.

Prior art CCD applications have been generally of a serpentine configuration, which is a back-and-forth serial transfer path. Charge packets are serially transferred in a first direction through a first row. They are then sensed and amplified, and then serially transferred through the second row in the opposite direction. This sequence of operations (transfer, sense and amplify, and then transfer in the opposite direction) is repeated for a plurality of rows.

Alternate configurations have been suggested in the prior art including parallel and series-parallel-series (SPS) registers. However, none of the suggested configurations were capable of high density storage, which is essential to any arrangement for actual utilization of CCDs in a computer environment. This is due in part to the fact that the prior art configurations were developed primarily for applications in the optical imaging field.

The clocking for the serpentine and most other prior art configurations has been two-or three-phase clocking. In this manner, only two or three clock drivers are required, but the storage density within the CCD is far less than optimal. Two-phase clocking requires two sites (or cells) per bit of information stored, thereby utilizing only 50% of the storage capacity. Three-phase clocking requires three sites per bit. Clearly, improvement upon these storage densities is desirable. Multiphase operation of registers have been proposed in the prior art. However, they have generally been inefficient; some have required a multiplexed rhombus configuration. In the optimum, it is desirable to approach one site per bit of information. Such high density could then be directly reflected in siginificant cost savings in computer memories systems which utilize CCD technology. An arrangement is also needed whereby high density CCDs are designed for usage in an environment which itself is highly efficient in its spacial requirements.

Another problem with CCD storage devices in general, and the serpentine configuration in particular, is that charge is dissipated as it is transferred from cell to cell. This imposes the requirement that there can be only a limited number of transfers of the charge packets before the introduction of a refresh operation, i.e. an amplification of the charge packet. It is noted that amplifiers do not perform the essential memory function, i.e. storage. Therefore, it is desirable to minimize the number of amplifiers required per bit of storage in order to achieve a high density environment for the register.

OBJECTS OF THE INVENTION

Accordingly, it is a principal object of the present invention to provide an improved charge-coupled device register.

It is also an object of the invention to provide a charge-coupled device register making optimum usage of space.

It is another object of the invention to provide a charge-coupled device register which consumes relatively less power than prior art devices.

It is still another object of the invention to provide an improved charge-coupled device register that is relatively simple and inexpensive to manufacture, and which may be made and driven by circuits utilizing commonly known MOSFET semiconductor manufacturing techniques.

It is a further object of the present invention to provide an SPS register with a relatively high number of respective storage sites per amplifier.

Yet another object of the invention is to provide an improved SPS charge-coupled device register which is driven by multiphase clock drivers.

Other objects and advantages of the present invention will become more apparent to one skilled in the art when read in conjunction with the drawings contained herewith.

SUMMARY OF THE INVENTION

The present invention provides a CCD storage register comprised of four basic components: input section, central section, output section, and a plurality of clock drivers. Data is stored and transferred in the form of small packets of charge.

The input section is a serial shift register, driven by two-phase push-clock operation. It provides a buffer for serially receiving an input stream of data in a synchronous manner, i.e. without halting the flow of data. The length of the input section (number of storage sites) is equal to twice the width of the central section (but may be decreased by one in certain embodiments). The input section aligns the packets of charge for parallel transfer into the central section in a single step. The storage sites of the input section are serially coupled to each other by means of gating sites responsive to a control clock.

The output section is also a serial shift register driven by two-phase push-clock operation. It provides a buffer for serially transmitting an output stream of data in a synchronous manner. The length of the output section is equal to one less than twice the width of the central section (but an additional site may be included in certain embodiments). The output section is aligned with the central section for parallel transfer of charge packets from the latter in a single step.

The central section is the main storage area of the register. It provides a plurality of serial shift registers which are aligned in parallel (comprising the width of the central section). In this manner, charge packets are received into, shifted through the length of and transmitted from the central section in parallel. The central section is coupled to the input section by gating means which, in combination with control clock drivers, buffer the flow of the charge packets into the central section. The central section is driven by a plurality of multiphase clock drivers.

The clock drivers provide both two-phase and multiphase drive signals to the register. The sums of the multiphase signals equal the two-phase signals. In this manner, all of the clock drive signals are obtained from three basic clock drivers, modified by appropriate circuitry.

BRIEF DESCRIPTION OF THE DRAWINGS

The invention will be described with reference to the accompanying drawings wherein:

FIG. 1A is a schematic diagram showing a cross-section portion of a staggered oxide conductivity connected charge-coupled device;

FIG. 1B is a schematic diagram showing a cross-section portion of an alternate embodiment of a CCD;

FIGS. 1C and 1D are representations of potential profiles for the device of FIGS. 1A and 1B;

FIG. 2 is a block diagram of an electrode-per-bit CCD storage system;

DETAILED DESCRIPTION OF THE PREFERRED EMBODIMENT

Figure 3:
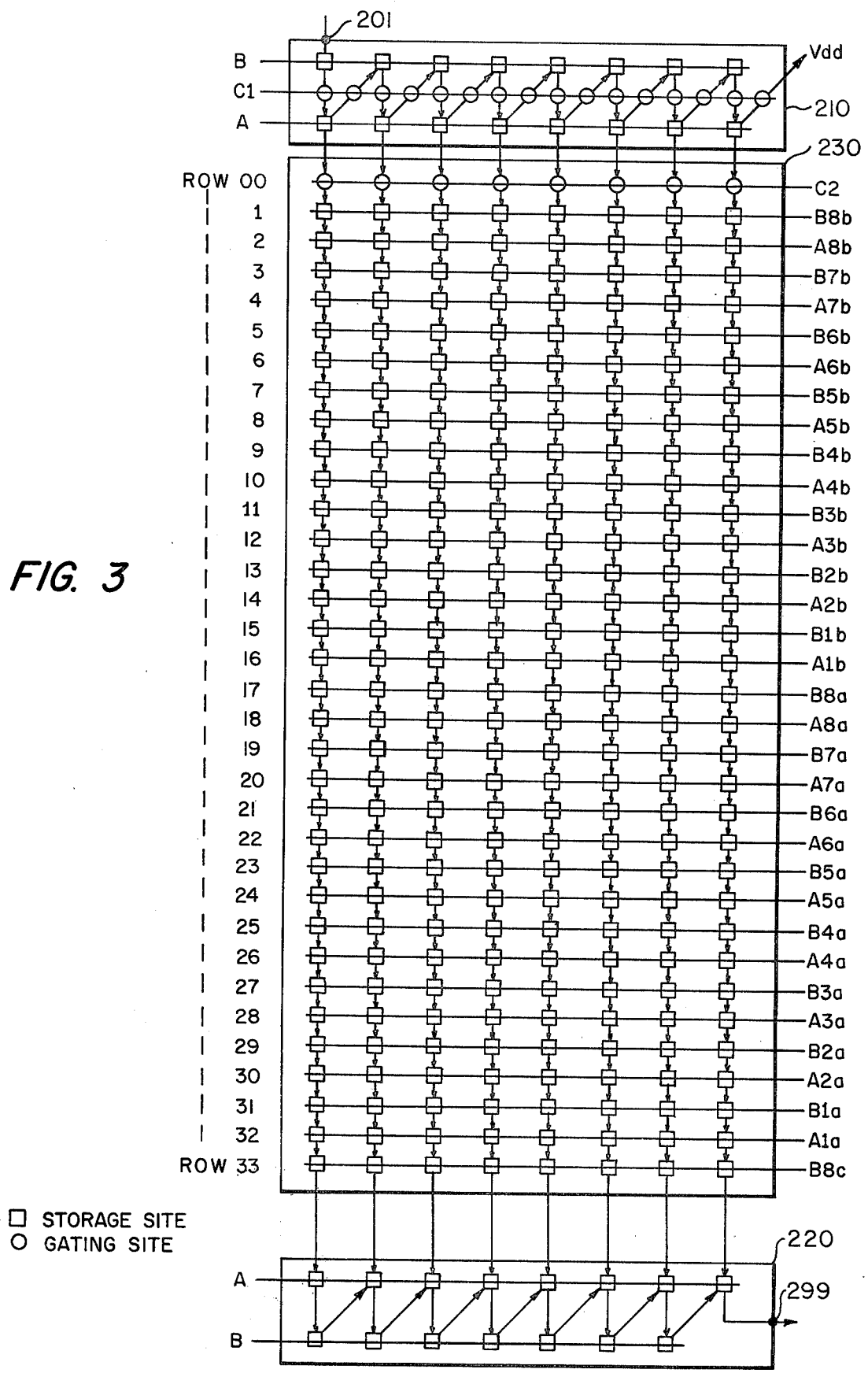
FIG. 3 is a diagram of an SPS register illustrating a preferred embodiment of the invention.

Before describing in detail the configuration for series-parallel-series (SPS) charge-coupled device (CCD) shift registers, it is desirable to describe in additional detail, the structure and operation of a conductivity-connected charge coupled device (C4D).

Referring now to FIG. 1A, there is shown a cross-sectional schematic diagram of a portion of a staggered oxide conductivity connected charge-coupled device, comprising a substrate 23 of N-type semiconductor material, staggered oxide layers 9 overlying the substrate 23, and various electrode pairs, 1-2, 3-4, 5-6, and 7-8, each pair being associated with and overlying a respective staggered oxide layer 9. The two electrodes of each electrode pair are electrically connected, either through the physical continuity of the electrode pair, or at the edge of the semiconductor device (not shown) in the event that the members of the electrode pair become separated during the course of the manufacturing process. The staggered oxide layer 9 is formed of an insulating material such as silicon dioxide ($SiO_2$). The composition of the electrodes may be metal, such as aluminum or gold, or it may be a polysilicon (polycrystalline silicon which has been diffused with impurity atoms).

As seen in FIG. 1A, alternate pairs 1-2, 5-6, etc. of electrodes are connected to a first voltage phase line 20, whereas the remaining electrode pairs 3-4, 7-8, etc. are connected to a second voltage phase line 21. This arrangement is utilized for two-phase push clock operation of the charge-coupled device (which is utilized in the input and output series section of the preferred embodiment), but it is understood that the device may be operated in other clocking modes, such as multiphase, (which is the case in the central section of the preferred embodiment). By alternately applying different voltages to lines 20 and 21, packets of charge representing information may be caused to move from left to right in the FIG. 1A representation, in a manner which is known in the art.

In the substrate areas underlying the gaps between adjoining electrode pairs are P++ diffusion regions 22. These regions may be formed by diffusing boron atoms, for example, into the N-type silicon substrate in standard doping densities, (e.g., $10^{18}$ to $10^{20}$ atoms per cubic centimeter). The diffusion regions 22 function essentially as conductive wires, in the sense that as one unit of charge enters a diffusion region from one side another unit of charge leaves the diffusion region from the other side. The physical operation of these diffusion regions is therefore to be distinguished from the manner in which charge is transported through the substrate, in that the charge itself is transported through the substrate in the latter case.

The use of these wire-like conductivity connecting regions 22 permits easy tapping into the charge-coupled device, as, for example, for the purpose of reading data non-destructively. Furthermore, it offers the advantage that as charge enters the region, charge also exits the region substantially simultaneously from the other end. Such operation is distinguishable from that of charge-coupled devices which lack diffusion regions, but have unsealed channels in the form of gaps between conductors. The present device is more tolerant to the presence of contaminants on the oxide surface which cause surface barrier instability.

Referring now to FIG. 1B, an alternate (to the staggered oxide) form of CCD is shown. This embodiment is functionally equivalent to the staggered oxide embodiment of FIG. 1A, but is formed by different processes. Specifically, instead of forming a unidirectional barrier between adjacent cells by virtue of a thick oxide region, this embodiment provides for a uniform oxide layer 9, but has an N+ region (shown as cross-hatched) in the forward portion of the cell site. The N+ region may be provided by an ion implantation process. Accordingly, in the description below with respect to FIGS. 1C and 1D, reference to electrode pairs 1-2, 3-4, 5-6 etc. of FIG. 1A is equivalent to reference to electrodes 11, 13, 15 etc. of FIG. 1B respectively.

Referring now to FIGS. 1C and 1D, potential profiles 24 and 25 respectively are shown for the conditions when the $\phi$ line 21 is more negative than the $\phi$ 1 line 20 (FIG. 1C) and when $\phi$ 1 line 20 is more negative than the $\phi$ 2 line 21 (FIG. 1D). The potential profiles 24 and 25 are shown corresponding to regions under substrate 23, and do not represent the actual physical dimensions of such a profile relative to the device dimensions. (In this regard, the relative dimensions of any of the elements in the drawing are not to be considered accurate, as they have been distorted for ease in understanding the invention. Typical dimensions for the embodiment shown in FIG. 1A are as follows:

substrate = 5 to 10 mils
thin oxide = 1000 Angstroms (A)
polysilicon = 3000 A
P++ region = 7500 A
barrier oxide = 3000 A Further information regarding physical dimensions for such devices is given in Related Application Nos. 1 and 2.)

The potential profiles 24 and 25 represent the depth of the potential wells formed below the corresponding electrodes and diffusion regions. For example, with respect to FIG. 1C, the more negative voltage applied to electrode pair 3-4 causes relatively deeper potential wells below electrodes 3-4 than below electrodes 1-2 and 5-6. (The converse is true with respect to FIG. 1D.) The applied negative voltage serves to repel majority carriers (electrons in the case of N-type substrate) from the surface of the substrate directly below the electrodes. The depth of the potential wells formed at the surface of the substrate depends first upon the relative magnitudes of the voltages applied to the electrode pairs, and second upon the thickness of the silicon dioxide layer between the individual members of the electrode pairs and the substrate. The thinner the layer of silicon dioxide beneath an electrode, the deeper is the potential well for a given voltage amplitude applied to that electrode. Accordingly, the potential well below electrode 4 is deeper than that below electrode 3.

The region of the substrate 23 corresponding to the P++ diffusion regions 22 is at a potential level substantially identical to that of the lower of the two adjoining potential levels. For example, the P++ diffusion regions 22 situated between electrode pairs 1-2 and 3-4 has a potential level substantially equal to that below electrode 3 in FIG. 1C. On the other hand, the potential level of this P++ diffusion region of the substrate 23 is at a potential level substantially identical to that of the substrate region immediately below electrode 2 in FIG. 1D. The manner by which the successive application of different voltage potentials to the electrode pairs results in the incremental shifting of charge through the device will be discussed in further detail below.

Referring now to FIG. 2, a block diagram of an electrode per bit CCD register storage system is shown. All of the components in the CCD register storage system are integrated within a single semiconductor chip which may contain a plurality of such register systems. (For additional details, see Related Application No. 7.) It is noted that a single line connecting various blocks within FIG. 2 may represent a plurality of connecting leads. Also, the unconnected arrowheads in FIG. 2 represent direction of flow of information bits. The basic element of FIG. 2 is Block 200 which represents an SPS register. SPS register 200 is comprised of three units: input serial register 210, output serial register 220 and central storage register 230. The input terminal 201 of register 200 is effectively the input terminal to input serial register 210. Bits of information in the form of charge packets are injected into input section 210 and are serially propagated through section 210. Each of the CCD sites (or cells) comprising section 210 is also connected to section 230. Section 210 is coupled to section 230 via a row of gates which allow parallel transfer of information into central section 230. Information bits are then propagated through the lengthwise section of central section 230. In the preferred embodiment, central section 230 is eight bits wide by 32 effective-bits long, thereby providing a 256-bit shift register. The arrows inside of section 230 represent the parallel propagation of information through section 230. At the other (output) end of section 230, the information bits in the form of charge packets are transferred into output serial section 220. Upon receiving the information bits, output section 220 transfers the bits serially to the output section output terminal, which is effectively the output terminal 299 of SPS register 200.

SPS register 200 receives, transfers, and transmits information in the form of small packets of charge, in the order of 50 to 230 $\times 10^{-15}$ Coulombs. Clearly, these charges are not of a level equivalent to logic signals at a system level. Accordingly, the register must be buffered in order to handle and transmit appropriate input and output signals.

The packets of charge emitted from SPS register 200 must be sensed and amplified, i.e. refreshed, before further propagation. Additionally, they must be converted to appropriate logic levels before they can be bussed to other system components. This is accomplished by sense amplifier 300 which has its input terminal 301 coupled to the output terminal 299 of SPS register 200. Amplifier 300 must be highly sensitive to be able to sense the very small packets of charge after they have been transferred through and decayed within the shift register 200. (For a detailed description of an amplifier which can serve as amplifier 300, see Related Application No. 4. It is also desirable to periodically perform a conventional refresh of the information bits stored in the register 200. This is performed by simply serially shifting the packets of charge from the register to the amplifier, and reinjecting them after they have been amplified. This operation is identical to a READ operation with the exception that the latter also entails busing the information, at a logic level, to other system components. Such output busing is done over output line OUT shown in FIG. 2.

Input busing may be done via line IN to amplifier 300. Accordingly, in this embodiment, amplifier 300 is considered to include interface circuitry responsive to control signals for directing the flow of information through the system to perform REFRESH, READ and WRITE operations. (For detailed description of such interface circuitry which may be used with sense amplifier 300, see Related Application No. 5.)

An output terminal 399 of amplifier 300 is also connected to the input terminal 101 of injector circuit 100, thereby forming an input path to register 200. Injector 100 acts to convert the system level signals into appropriate charge packets. These charge packets are then transferred from the output terminal 199 of injector circuit 100 to the input terminal 201 of register 200. (For detailed description of injector 100, see Related Application No. 3.)

Referring now to FIG. 3, multiphase SPS register 200 is shown in detail. In FIG. 3, squares are representative of storage sites and circles are representative of gating sites. Both types of regions are integrated within the sites. Typically, sites are from ¼ to ½ mil square in size. Storage sites are generally filled to only about 75% of their capacity (when storing a 1 bit representation) in the preferred embodiment and allow for only a unidirectional flow of charge. This may be the result of ion implantation or staggered oxide layers or other means. (However, the lower row of storage sites of input section 210 are provided with two (or branched) output paths (allowing for either serial propagation through input section 210 or parallel transfer to central section 230) and the upper row of cells of output section 220 are provided with the two (or branched) input paths (allowing for either parallel input from central section 230 or for serial propagation through output section 220)). Such unidirectionality may be obtained by ion implantation (for example phosphorus) or by staggered oxide layers as described in Related Application No. 1 or by other means. The gating regions may be obtained by fully implanting the regions below the electrodes, whereby a region is not capable of storing charge but acts as a barrier responsive to voltage levels applied to its electrode for gating the flow of charge. In other words, fully implanted regions act as MOS transistors which have threshold levels of about 6 volts (as opposed to non-implanted transistors which have threshold levels of about 2 volts).

In the preferred embodiments, SPS register 200 is eight bits wide, i.e. eight bits are transferred in parallel through the length of central section 230. Embodiments with alternate widths are clearly possible within the scope and spirit of this invention. However, in this invention, central section 230 is eight-bits wide whereas input and output sections 210 and 220 are 16 and 15 bits in serial length respectively. (Other embodiments wherein section 210 is 15 bits wide and/or section 220 is 16 bits wide are possible. However, timing factors with respect to the preferred injector and detector circuits make these widths preferable.) Furthermore, the actual physical width of input section 210 must be sufficient to accommodate the 15 gating sites between the two rows of storage sites. This wide structure is in constrast to that utilized in Related Application No. 8 which is only eight-bits wide. Yet the structure disclosed in this invention has utility which may, in certain circumstances, more than compensate for the width requirements of input section 210. Specifically, this invention does not require special input clock drivers which may be both complex and space consuming. Since the primary concern of any CCD storage register is high density, the overall system advantage of fewer clocks may be beneficial in various applications of the present invention.

Input serial section 210 is operated so that a synchronous and continuous data stream is possible, both in input section 210 and to parallel section 230. Input serial section 210 is a two-phase CCD shift register and contains 16 identical storage sites represented by the squares. The 16 sites are coupled serially and internally on the substrate via the row of gates. The coupling between the cells shown in FIG. 3 as unidirectional arrows is distinct from the coupling of and to the electrodes. The electrodes are formed on the semiconductor chip above each of the sites. (The electrodes are shown in FIG. 3 as passing through the center of each site, i.e. each circle or square.) They carrry the drive or clock signals. The electrode above (to) the first row of storage sites in input serial register 210 is connected to driver B. The electrode to the second row of storage sites is connected to driver A. The electrode to the 15 gating sites is connected to driver C1. These phase drivers are discussed in additional detail below. Also shown as part of input section 210 is an annihilator circuit. This is necessary to avoid an undesired and uncontrolled build-up of residual charge in input section 210. In the preferred embodiment, the annihilator is comprised of an additional gating site coupled to $V_{dd}$.

In the embodiment shown in FIG. 3, the input terminal 201 of SPS register 200 is coupled to the first (leftmost) cell of the upper row of input section 210. An alternate 15-bit wide embodiment of input section 210 would instead have input terminal 201 coupled to the first cell of the lower row of input section 210, and the first cell of the upper row would be omitted. It is noted that such a modification would add favorably (though modestly) to density factors and would require modification of the timing of injector circuit 100. Specifically, injector 100 must provide for charge injection into a cell whose electrode is connected to phase A instead of phase B. However, this is a straightforward transposition of phases A and B with respect to each other, as would be obvious to those of ordinary skill in the art.

The central section 230 of SPS register 200 is an effective eight by 32 (256) bit storage register. It contains, however, an additional row of storage sites required for achieving an optimal working density (which approaches one information bit per storage site). Also, a control or gating row (row 00) is considered part of central section 230. It will be obvious to those skilled in the art that this control row may be considered a separate section of SPS register 200 or a part of input serial register 210. Such classification is not essential to an understanding of the invention. Accordingly, the first row (row 00) of central section 230 contains eight fully-implanted sites which do not store charge, but merely act as gates responsive to the drive signals applied to their electrodes. As can be seen in FIG. 3, the electrodes of all of the sites in row 00 are commonly connected to driver C2. The next 33 rows (rows 1 to 33) of central section 230 from eight parallel columns of serially-connected storage sites. These columns may be considered as eight serial shift registers in parallel, each containing 33 cell sites. However, they function quite differently than a conventional two-phase CCD shift register, as will be explained below. Each row has a driver associated with it which is commonly connected to the electrodes of all of the sites in that row. As shown in FIG. 3, driver B8c is coupled to row 33, drivers A1a, A2a, . . . A8a drive rows 32, 30, . . . 18 respectively; drivers B1a to B8a drive rows 31, 29, . . . 17 respectively; drivers A1b to A8b drive rows 16, 14, . . . 2 respectively; and drivers B1b to B8b drive rows 15, 13, . . . 1 respectively. The outputs of each site of row 33 are connected to respective site positions in the first row of output section 220. Output serial section 220 contains 15 serially-connected storage sites; the first row contains eight sites and the second row contains seven sites. The electrodes of sites of the first storage row are connected to driver A and the electrodes of sites of the second storage row are connected to driver B. In the embodiment shown in FIG. 3, the last (rightmost) cell of the upper row of output section 220 is coupled to output terminal 299 of SPS register 200. A 16-bit embodiment would provide for an additional cell in the bottom row of output section 220. This additional cell would couple the last cell of the top row to output terminal 299 and its electrode would be gated by phase B (as are all of the cells of the bottom row of output section 220.) This modification would alter the timing of the emission of charge from SPS register 200 and sense amplifier 300 would have to be modified to accommodate this change.

Figure 4:
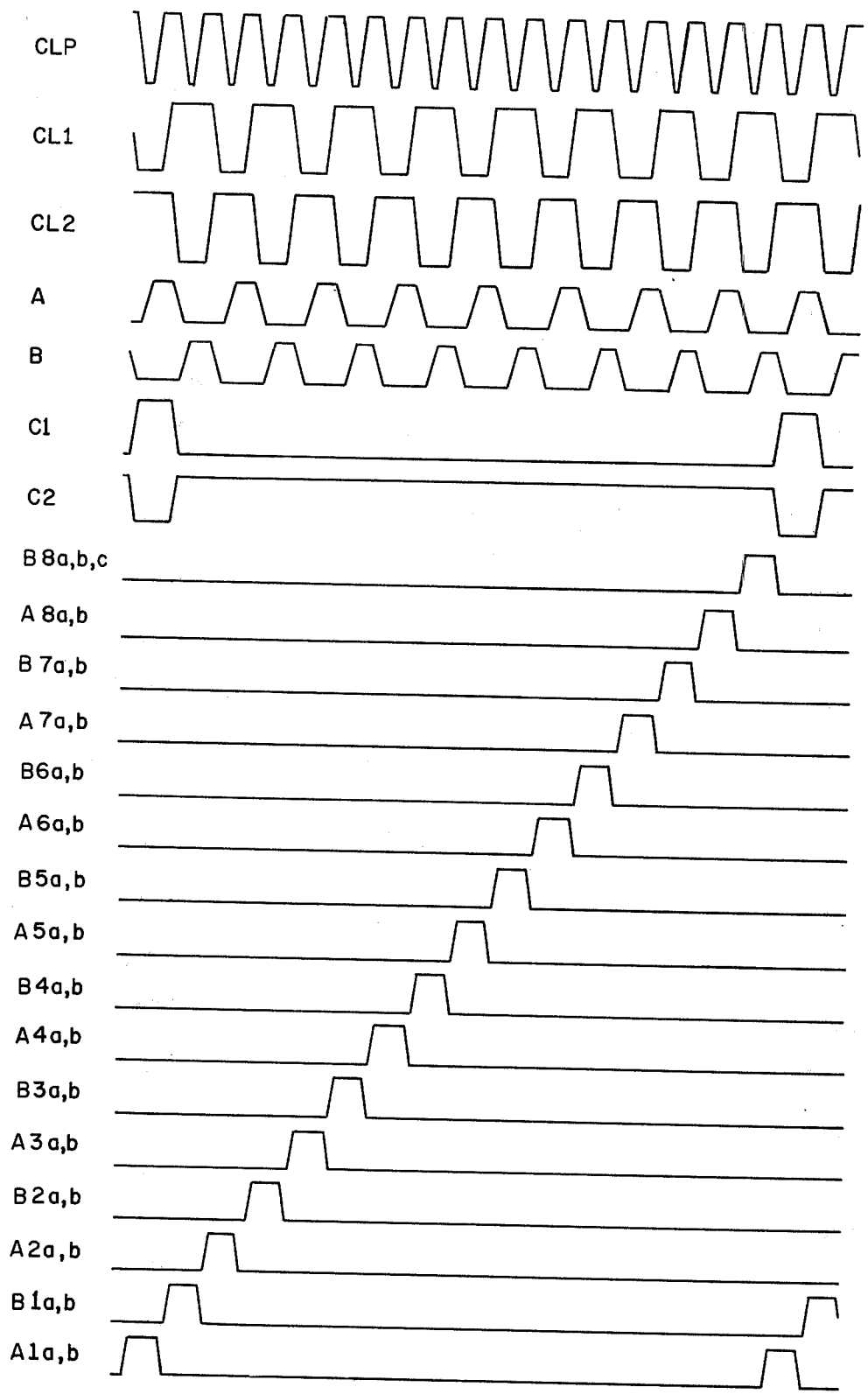
FIG. 4 is a timing diagram showing the relationships between the clock signals for driving the SPS register according to the preferred embodiment of the invention.

Referring now to FIG. 4, the phase relationships and relative amplitudes of the various clocks and drivers fro SPS register 200 are shown. Clocks CLP, CL1 and CL2 are system clocks whose signals are bused to arrays comprised of a plurality of registers according to the invention. CLP is a 2 MHZ clock, whereas CL1 and CL2 are complementary 1 MHZ clocks. The other waveforms shown in FIG. 4 are generated by circuitry shown infra, and are generally referred to as phase drivers. It is noted that phase A and phase B are related so as to provide a two-phase clock drive for serial registers 210 and 230, i.e. phase A and phase B are 180° out of phase with respect to each other. Phases A1 to A8 are on except for a short off pulse; the sum of these pulses equals phase A. Phases B1 to B8 have the same properties (with respect to phase B). Phase C2 is a short enabling pulse. One final note is that in the preferred embodiment, the CCDs are P-channel devices. Accordingly, an on-pulse is a relatively negative voltage level and an off-pulse is a relatively positive voltage level.

Figure 5:
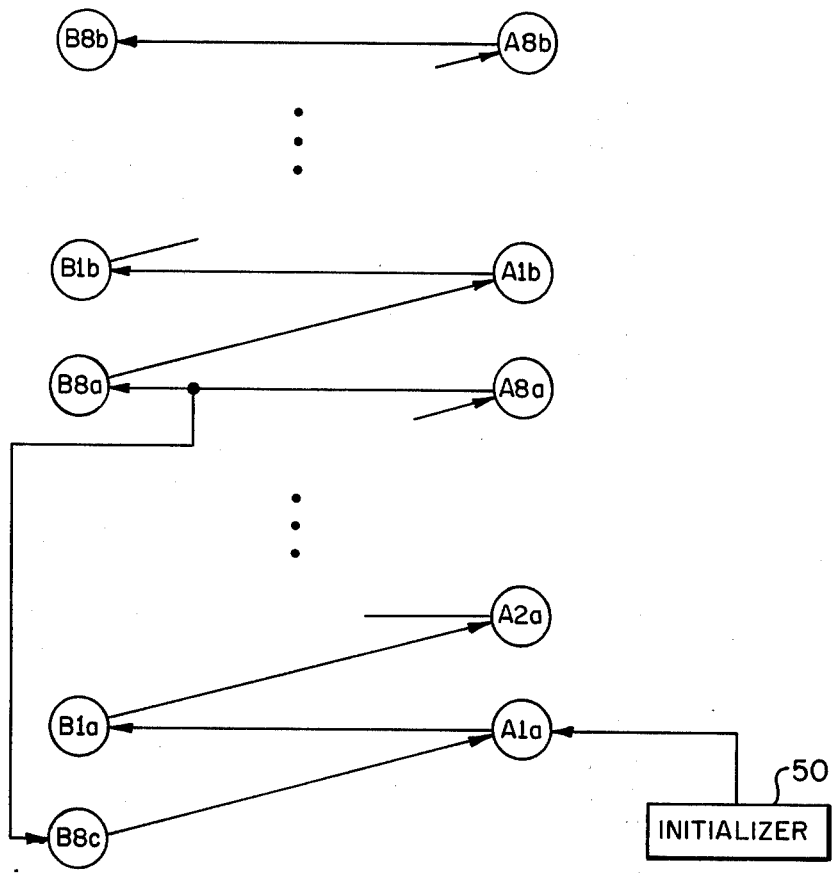
FIG. 5 is a schematic diagram showing the serial relationship between the clock driver circuits for multiphase driving of the SPS register.

Referring now to FIG. 5, the phase relationships of the multiphase drivers for central section 230 are shown. Each circle of FIG. 5 represents the circuit for generating the labelled drive pulse. The lines connecting the circles represent the actual electrodes (polysilicon lines) connecting the drivers and the direction of the arrowhead indicates both the responsiveness of the drivers and the actual direction of the flow of signals between driver circuits. It is noted that all of the A-related drivers are in a column on one side, whereas all of the B-related drivers are on the opposite side. This conforms to the preferred alignment of these drivers on a chip whee SPS registers are combined in a manner to form an array. It is noted that one set of drivers is required for each array, and an array contains a plurality of SPS registers. FIG. 5 shows the phase relationships of the multiphase drivers equivalent to a logical 1 propagating through a shift register. This is analogous to an empty (extra) row propagating in a reverse direction (upwards) through central section 230. An initializer circuit 50 is required when power is first turned on in the system (which may be thought of as generating the initial 1 which propagates through shift registers). A feedback loop is formed by the path from driver $D_{B8c}$ back to the first driver $D_{A1a}$.

For the remaining circuit diagrams, implementation is envisioned as large-scale integrated (LSI) circuits. The circuit elements including metal-oxide-semiconductor (MOS) transistors, are formed within the same semiconductor chip as the SPS CCD register. Accordingly, P-channel transistors are utilized, consistent with the characteristics of the CCD N-type substrate. For a more detailed description of the MOS transistors shown in circuits 6 through 9, refer to U.S. Pat. No. 3,755,689, issued Aug. 28, 1973, entitled "Two-Phase Three Clock MOS Logic Circuits" by Elmer et al.

Figure 6:
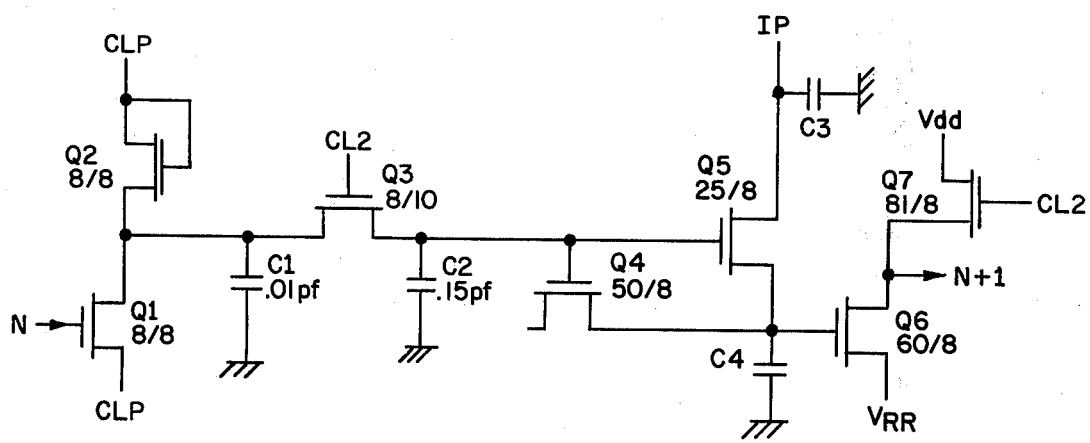
FIG. 6 is a circuit diagram showing the basic circuit for the multiphase drivers for the parallel section of the SPS register.

Referring now to FIG. 6, a circuit for one of the phase drivers represented in FIG. 5 is illustrated. It should be noted that there are 33 multiphase drive signals and hence 33 driver circuits required for a register, that is, a different phase driver circuit for each of A1a to A8a, B1a to B8a, A1b to A8b, B1b to B8b and B8c is required. The phase $D_N$ represents the input signal to the circuit which generates phase $D_{N+1}$ as the output signal. The relationship between the various phases were shown in FIG. 5. The capacitances are shown connected to the substrate. In fact, these capacitances may be inherent in the circuit. Nonetheless, the substrate is at a voltage level sometimes referred to as $V_{BB}$, + 14 volts. The circuits for each of the phase-A related drives are identical (and as shown in FIG. 6) with the exception of the differing input lines for each different phase. The circuits for the B-related drivers have the following additional changes from FIG. 6: a signal from clock CL2 should be replaced by a signal from clock CL1; input phase 1P should be replaced by input phase 2P. The only other exception to the generalized circuit shown in FIG. 6 is for the driver circuit for phase A1a. When first turning on the power for the system, the driver circuit for phase A1a must get a signal from the initializer circuit 50 instead of from phase B8c. Hence the input line to the circuit for phase A1a is connected both to the output of phase B8c and to the output of the initializer circuit 50.

In general in the remaining figures, the circuits shown are for phase-A related drivers. The only difference between A and B-related drivers is the transposition from clock CL1 to clock CL2 (or from clock CL2 to clock CL1), and from phase 1P to phase 2P (or from phase 2P to phase 1P).

Figure 7:
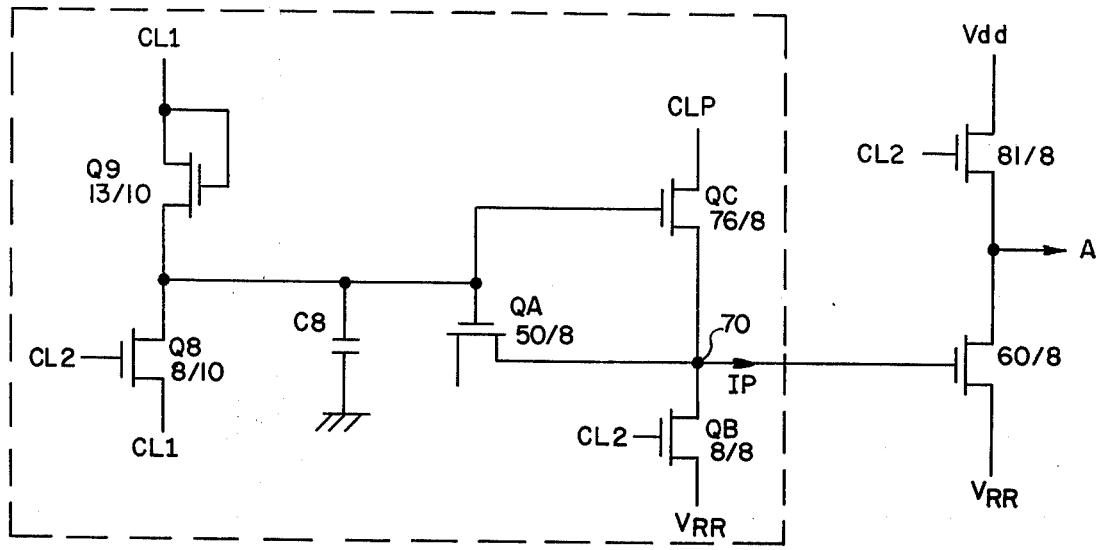
FIG. 7 is a circuit diagram showing the circuit for the two-phase clock signals for driving the input and output sections of the SPS register.
Figure 8:
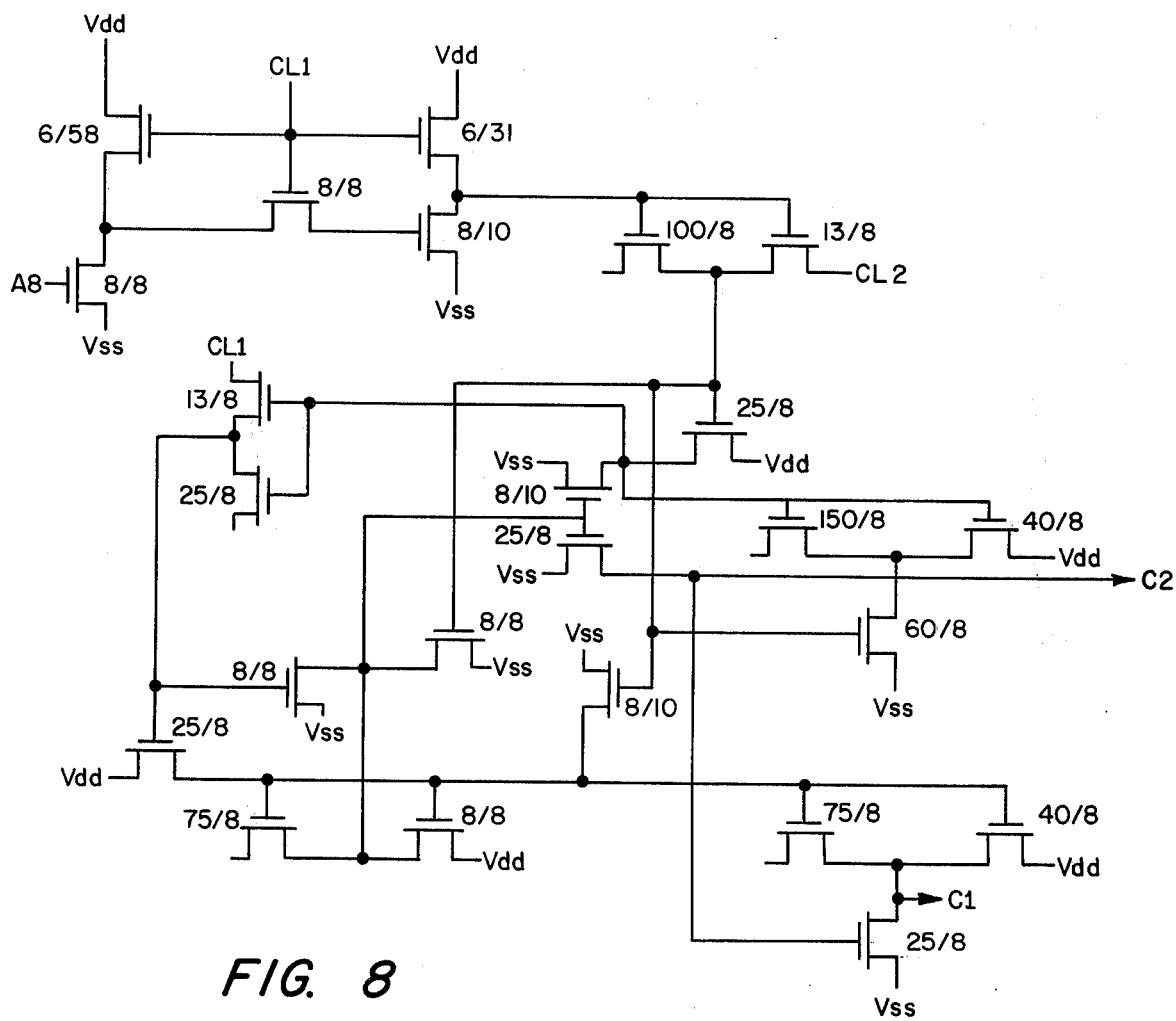
FIG. 8 is a circuit diagram showing the circuits for providing the clock signals for driving the gating sites of the input and central sections of the SPS register.

Referring now to FIG. 7, a circuit is shown for one of the basic two-phase drivers required by SPS register 200. The circuit shown is for the driver A for phase A. (The driver for phase B is identical with the exception of the transposition discussed above.) The part of the circuit shown within the dotted lines is a basic circuit for all phase-A related drivers. The output of this part of the circuit is called phase 1P, which is present at point 70. As can be seen from the other remaining Figures, point 70 connects phase 1P to the other circuits. FIG. 8 shows the circuits for producing phases C1 and C2.

Figure 9:
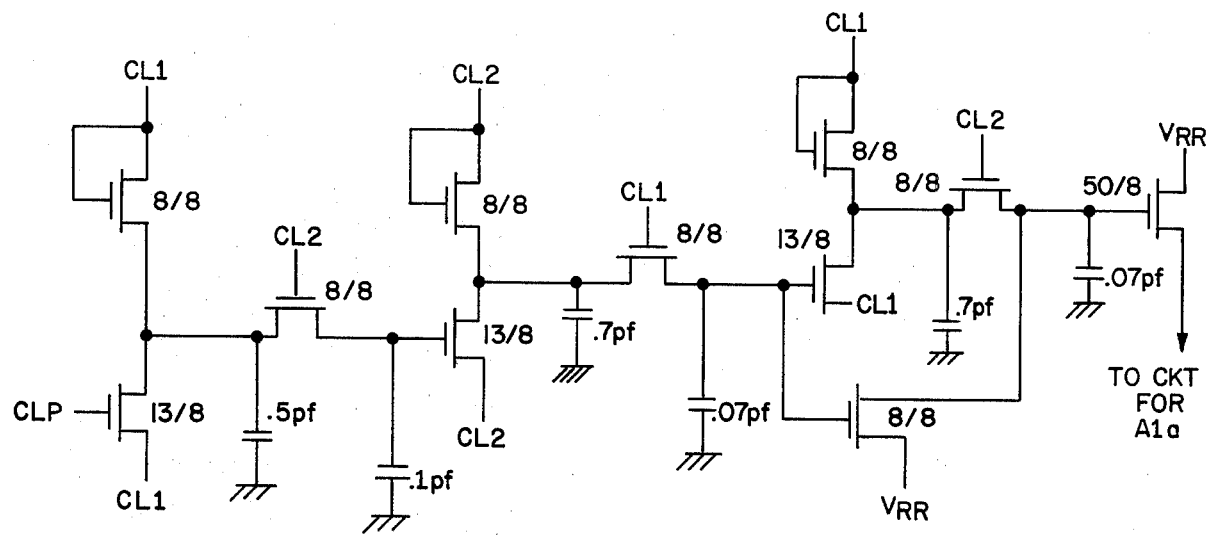
FIG. 9 is a circuit diagram showing the initializer circuit for the clock driver circuits for multiphase driving of the parallel section of the SPS register.

Referring now to FIG. 9, the initializer circuit 50 is shown. The output of this circuit is connected as an input to the driver circuit for producing phase A1a. The multiphase timing of the initializer circuit is such that the pulse received as an input to the circuit for phase A1a would normally be generated by phase B8c. However, since phase B8c would not occur when the system is off, i.e. prior to initialization, this circuit generates the initial phase driver loop pulse.

DESCRIPTION OF THE OPERATION OF THE PREFERRED EMBODIMENT

The following description of the operation of SPS register 200 can be best understood by the following description when read in conjunction with FIGS. 2, 3 and 4. With respect to input serial register 210, if the two rows of cell sites were connected directly to each other (instead of indirectly via the row of 15 gating sites, simple two-phase push clock operation of (16-bit) input section 210 would result. In other words, information bits would be continually received at the input of the first storage site of the first row and continually be transferred serially (down and then up-and-across) through the register. However, it is emphasized that the purpose of input serial register 210 is to act as an input buffer for the central section 230, i.e. to receive the information bits and to align them for parallel transfer into the high-density central section 230. Accordingly, operation is modified to achieve the desired alignment in the bottom row of input section 210. Since the maximum density of a two-phase shift register is one bit per two sites, an information bit can be transferred into input section 210 at most on every other pulse. After receiving a data bit, the bit must be transferred before an additional data bit can be received. The timing relationships given in FIG. 4 are such that after eight bits of data are aligned in the bottom row of input register 210, it is desired to transfer these bits into central section 230. Accordingly, phase C2 enables the row 00 of central section 230 thereby providing a path for transfer of the information bits into row 0. Simultaneously, phase C1 disables the serial transfer of charge into the top row of input section 210. In other words, the normal serial flow path is shut off and the special parallel flow path is enabled.

Serial input register 210 acts synchronously. By this it is meant that the first cell site of the top row continues to receive data bits even when the information bits are transferred in parallel into the parallel section. Accordingly, on the next cycle, data bits are aligned in the bottom row again. Due to this operation, of input serial register 210, not only is synchronous operation of SPS register 200 provided, but no special clocks for driving input section 210 are required. This has system advantages of simplicity and possibly high density.

Not only is an encoding scheme required at the input of the SPS register, but a decoding scheme is required at its output since data bits may once again occupy only every other cell in the output section 220. Phase B8c enables transfer of data out of central section 230. The information is transferred to the first row of output section 220 directly from the central section 230. Phase drivers A and B drive the output section 220 in two-phase push-clock operation and transfer the data serially through the two rows of section 220 and then out of output section 220. Phase driver B8c transfers 8 bits of data in parallel to the first row of output section 220. These bits are then transferred serially through the output section 220. In this manner, synchronous output operation is achieved. Charge packets are applied as an input from injector 100 to SPS register 200 and are transmitted as output to amplifier 300 at the rate of one MHZ.

Referring once again to FIG. 3, parallel transfer of data bits in the form of packets of charge occurs through the central section 230 as follows. A packet of charge can be transferred from a first cell to a second, only if the second cell does not at the time of the attempted transfer already contain a charge packet; that is to say, the second cell must be empty (in a ready state) in order to receive the charge. The object of utilizing a multiphase SPS storage register is to achieve high density storage. The highest density possible is to have every storage site contain data. However, this is in conflict with the requirement of having a row ready for receiving data by being empty. Therefore, in order to get an operable storage register, at least one row must be empty. If there were only one empty row in central section 230, there would be a requirement for at least 32 different phase relationship for multiphase driving of the register. In the preferred embodiment, there are effectively two empty rows. (Thirty-three rows are provided in central section 230, and the bottom row of input section 210 acts as a storage row in the parallel transfer operation.) The second empty row is utilized so as to allow for relatively simplified multiphase clocking. As can be seen (once the system is initialized) the clock (drive) pulses used for driving the upper half of the register (rows 1 to 16) are identical to those used for driving the lower half of the register (rows 17–32). In this manner, only half as many phase relationships are required. This trade-off could be continued, doubling the number of empty rows while halving the number of phase drivers required. The end point of this trade-off is simply two-phase operation of the central section where two phases or merely two clocks are required, but at the cost of having every other row empty.

The relationships of the phase drivers are such that the data in each row is moved down one row for each period in which a new row of data is transferred into the first storage row (row 1) of the central section. To better understand this operation, assume data has just been transferred out of central section 230. Therefore, row 33 is empty and is ready to receive data. Accordingly, row 32 is pulsed (high) which transfers its data into row 33. Following this, row 31 is pulsed, transferring its data into row 32. This continues whereupon row 17 is pulsed to transfer its data into row 18. At this point, row 17 is empty. The transfer of data (down) in this manner is equivalent to transferring the empty row (up) backward through the central section. At the same time as the empty row is transferred from row 17 to row 16, data is once again transferred out of row 33. In this manner, a new empty row is introduced into the parallel section. Another cycle of operation once again transfers the data from 32 to 33, from 31 to 32, etc., but it can be seen that at the same time data goes from 15 to 16, 14 to 15, etc. and from row 1 into row 2. In other words, two parallel transferring operations occur simultaneously within the central section, transferring two empty rows (separated by 16 rows) upwards through the register. After the data in row 1 is transferred to row 2, new data may be transferred into row 1. Control line C2 is enabled, control line C1 is disabled and eight bits of data are transferred from the second row of input register 210 into row 1 of the central section 230.

It should be emphasized that an empty row is distinct from a row carrying charge representative of a logical 0. An empty row contains no charge, and hence may receive either a zero (about $50 \times 10^{-15}$ Coulombs) or a one (about $230 \times 10^{-15}$ Coulombs). Accordingly, a logical 0 is sometimes referred to as a "fat zero". (For additional details concerning charge levels, refer to Related Application Nos. 3 and 4.)

The multiphase SPS structure offers high storage density and economical integration of clock drivers on a memory chip. The high density of the electrode-per-bit array combined with both the low power consumption of the multiphase system and the elimination of external drivers, form the basis of an attractive memory system. Since the data stream is synchronous and clocks are (for the most part) internally generated, this system offers ease of use.

In the preferred embodiment, all transistors are MOSFET transistors. Accordingly, low signals enable the transistors and high signals turn the transistors off. In the diagrams, sizes for the transistors are given in terms of surface area of a semiconductor chip. The sizes are shown as width over length ($w/l$) in microns and are not in anyway meant to be restrictive as alternate geometries may be employed to the same effect.

The above description is included to illustrate the operation of the preferred embodiment and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A charge-coupled device (CCD) shift register for storing bits of information in the form of packets of charge comprising:
    a plurality of driver circuits including:
        first and second driver circuits for generating a first and second pulse train respectively, said first and said second pulse trains being 180° out of phase, and other driver circuits for generating multiphase pulses; the sum of a first portion of said other pulses equalling said first pulse train and the sum of a second portion of said other pulses equalling said second pulse train;
    input means responsive to said first and said second pulse trains for serially transferring said packets of charge through said input means;
    output means responsive to said first and said second pulse trains for serially transferring said packets of charge through said output means; and
    central storage means responsive to said other driver circuits for multiphase parallel transfer of a plurality of said packets of charge through said central storage means, said central storage means coupled to receive in parallel said plurality of said packets of charge from said input means and coupled to transmit in parallel said plurality of said packets of charge to said output means.

2. The CCD register of claim 1 wherein said input means comprises:
    circuits for generating first and second control signals, said first and second control signals being complementary;
    a first row and a second row of storage sites forming in combination a serial register for said packets of charge, said first row responsive to said first pulse train and said second row responsive to said second pulse train;

a third row of gating sites coupling storage sites of said first row to respective sites of said second row, said third row providing a controlled transfer path between said first and said second rows, said third row responsive to said first control signal for disabling said transfer path;

said central storage means comprising a first row of gating sites responsive to said second control signal for enabling parallel transfer of said plurality of said packets of charge from said second row of storage sites to said central storage means.

3. The CCD register of claim 2 wherein said input means further comprises annihilator means coupled to the last site of said serial register, said annihilator means preventing the build-up of residual charge in said serial register.

4. The CCD register of claim 1 wherein said output means comprises:

a first and a second row of storage sites, said first row receiving said plurality of said packets of charge from said central storage means in parallel, alternate sites of said first and said second rows respectively coupled to form a serial shift register for said packets of charge, said first and said second rows responsive to said second and said first pulse trains respectively.

5. The CCD register of claim 1 wherein said central storage means comprises rows of storage sites, each of said rows coupled to one of said other driver circuits and wherein consecutive rows are coupled alternately to circuits which generate said first and said second portions of said other pulses respectively and wherein said plurality of said packets of charge are transferred in parallel from row to row.

6. The CCD register of claim 5 wherein said input means, said output means and said central means are comprised of unidirectional storage sites, whereby said packets of charge may be transferred in only one direction through said storage sites.

7. The CCD register of claim 6 wherein each of said storage sites comprises a staggered oxide layer between the substrate and the respective electrode, whereby said unidirectionality is obtained.

8. The CCD register of claim 6 wherein each of said storage sites comprises an ion implanted region in the substrate below part of the respective electrode, whereby said unidirectionality is obtained.

9. The CCD register of claim 1 wherein the sites are conductivity-connected by P++ diffusion regions between respective sites.

10. A CCD shift register for storing bits of information in the form of packets of charge comprising:

a first plurality of driver circuits including a first driver circuit for generating a first pulse train and other driver circuits for generating other pulses, the sum of said other pulses equalling said first pulse train;

a second plurality of driver circuits including a second driver circuit for generating a second pulse train and multiphase driver circuits for generating remaining pulses, the sum of said remaining pulses equalling said second pulse train; said second pulse train being 180° out of phase with respect to said first pulse train;

input means responsive to said first and second driver circuits for enabling the serial transfer of said packets of charge through said input means, said input means containing $2n$ storage sites and being capable of storing $n$ of said packets of charge at any one time, said packets of charge occupying at most every other of said $2n$ storage sites;

output means responsive to said first and said second driver circuits for enabling the serial transfer of said packets of charge through said output means, said output means containing $2n-1$ storage sites and being capable of storing $n$ of said packets of charge at any one time, said packets of charge occupying at most every other of said $2n-1$ storage sites; and central storage means responsive to said other and said remaining driver circuits for enabling the multiphase parallel transfer of $n$ of said packets of charge through said central storage means, said central storage means coupled to receive $n$ of said packets of charge in parallel from said input means and coupled to transmit $n$ of said packets of charge in parallel to said output means.

11. The CCD register of claim 10 further including a first circuit for generating a first control signal and wherein said central storage means further includes:

input gating means responsive to said first control signal for providing a controlled path for the parallel transfer of $n$ of said packets of charge from said input means to said central storage means, and said central storage means is aligned in $m$ rows and $n$ columns, each of said $n$ columns comprising a serial register of length $m$, alternate of said $m$ rows responsive to one of said other pulses and one of said remaining pulses respectively.

12. The CCD register of claim 11 wherein the $m$ rows are coupled in parallel to each other and wherein each of said $n$ columns comprises $m$ storage sites serially connected.

13. The CCD register of claim 11 further including a circuit for generating a second control signal complementary to said first control signal wherein said input means comprises $2n-1$ gating sites, each of said gating sites coupling consecutive pairs of said $2n$ storage sites, said gating sites responsive to said second control signal.

14. The CCD register of claim 10 wherein said input means further comprises annihilator means coupled to the last site of said input means, said annihilator means preventing the build-up of residual charge in the sites comprising said input means.

15. The CCD register of claim 10 wherein each input means, said output means and said central means are comprised of unidirectional storage sites, whereby said packets of charge may be transferred in only one direction through said storage sites.

16. The CCD register of claim 15 wherein each of said storage sites comprises a staggered oxide layer between the substrate and the respective electrode, whereby said unidirectionality is obtained.

17. The CCD register of claim 15 wherein each of said storage sites comprises an ion implanted region in the substrate below part of the respective electrode, whereby said unidirectionality is obtained.

18. The CCD register of claim 10 wherein the sites are conductivity-connected by P++ diffusion regions between respective sites.

19. A CCD shift register for storing bits of information in the form of packets of charge comprising:
- a first plurality of driver circuits including a first driver circuit for generating a first pulse train and other driver circuits for generating other pulses, the sum of said other pulses equalling said first pulse train;
- a second plurality of driver circuits including a second driver circuit for generating a second pulse train and remaining driver circuits for generating remaining pulses, the sum of said remaining pulses equalling said second pulse train; said second pulse train being 180° out of phase with respect to said first pulse train;
- input means responsive to said first and said second driver circuits for enabling the serial transfer of said packets of charge through said input means, said input means containing $2n-1$ storage sites and being capable of storing $n$ of said packets at any one time, said packets of charge occupying at most every other of said $2n-1$ storage sites;
- output means responsive to said first and said second driver circuits for enabling the serial transfer of said packets of charge through said output means, said output means containing $2n$ storage sites and being capable of storing $n$ of said packets of charge at any one time, said packets of charge occupying at most every other of said $2n$ storage sites; and
- central storage means responsive to said other and said remaining driver circuits for enabling the parallel transfer of $n$ of said packets of charge through said central storage means, said central storage means coupled to receive $n$ of said packets of charge in parallel from said input means and coupled to transmit $n$ of said packets of charge in parallel to said output means.

* * * * *